United States Patent [19]

Urata et al.

[11] Patent Number: 4,887,548
[45] Date of Patent: Dec. 19, 1989

[54] THIN FILM MANUFACTURING SYSTEM

[75] Inventors: Kazuo Urata; Naoki Hirose; Shigenori Hayashi, all of Atsugi, Japan

[73] Assignee: Semiconductor Energy Laboratory Co., Ltd., Kanagawa, Japan

[21] Appl. No.: 193,680

[22] Filed: May 13, 1988

[30] Foreign Application Priority Data

May 15, 1987 [JP] Japan ................................ 62-118600

[51] Int. Cl.⁴ ............................................. C23C 16/48
[52] U.S. Cl. .................................... 118/722; 118/715; 118/50.1; 427/54.1
[58] Field of Search ....................... 118/715, 722, 50.1; 427/54.1

[56] References Cited

U.S. PATENT DOCUMENTS 4,767,641 8/1988 Kieser ................................... 118/723

FOREIGN PATENT DOCUMENTS

| 59-3931 | 1/1984 | Japan . | |
|---|---|---|---|
| 60-130126 | 7/1985 | Japan | 427/53.1 |
| 60-166030 | 8/1985 | Japan | 118/728 |
| 60-245217 | 12/1985 | Japan . | |
| 2141386A | 12/1984 | United Kingdom . | |

Primary Examiner—Richard Bueker
Attorney, Agent, or Firm—Sixbey, Friedman, Leedom & Ferguson

[57] ABSTRACT

A thin film manufacturing system comprises a reaction vessel with a window that is transparent to ultraviolet radiation; a means of exhausting gas from the reaction vessel to a reduced pressure condition, a means of introducing a gas into the reaction vessel to form a thin film, a source of ultraviolet radiation that activates the gas, and slits provided at a predetermined interval on the window that is transparent to ultraviolet radiation.

3 Claims, 4 Drawing Sheets

THIN FILM MANUFACTURING SYSTEM

FIELD OF THE INVENTION

This invention relates to a system for manufacturing a thin film of photochemical vapor reaction product on a substrate.

BACKGROUND OF THE INVENTION

In recent years, the photochemical vapor reaction method (referred to below as the photo CVD method of manufacturing thin films for polycrystalline silicon semiconductor or passivation use and other thin films has attracted considerable attention.

Prior art equipment used in manufacturing this photo CVD method use an arrangement in which a substrate on which the thin film is to be formed is placed inside a reaction chamber having a window that is transparent to ultraviolet radiation. A gas used for forming the thin film is introduced under reduced pressure. Ultraviolet radiation passes through the window transparent to it and causes a photo CVD reaction inside the reaction vessel. The reaction product deposits on the substrate, where it forms a thin film. The window that is transparent to ultraviolet radiation is made of a material that passes ultraviolet radiation easily, such as quartz glass, lithium fluoride or magnesium fluoride.

Methods of increasing the rate of thin film formation including adding mercury into the reaction vessel, together with the gas that is used to form the thin film. To make it possible to form a thin film of large area, the pressure inside the ultraviolet radiation source chamber is decreased, and the window that is transparent to ultraviolet radiation is enlarged.

However, since this photo CVD method requires ultraviolet radiation to be introduced into the reaction vessel through a window that is transparent to ultraviolet radiation, a thin film forms not only on the substrate but also on the window transparent to ultraviolet radiation, so that although sufficient ultraviolet radiation passes through the window into the reaction vessel in the initial stage of the reaction, as the reaction proceeds, a thin film forms on the window, reducing the amount of ultraviolet radiation that passes through; eventually the thin film stops forming on the substrate.

For this reason, when this method is used to form a thin film, there is a limit to thin film thickness; if a film thicker than that limit is to be formed, the window transparent to ultraviolet radiation must be cleaned, and a similar reaction carried out all over again.

This limiting film thickness differs somewhat depending on the type of film being formed; for example it is 800 angstrom units to 1,000 angstrom units for a silicon nitride film, and on the order of 600 angstrom units to 800 angstrom units for an amorphous silicon semiconductor film.

One method that has been proposed for solving this problem is that the inside (reaction vessel side) of the window transparent to ultraviolet radiation be coated, but this has the problem that the oil constituents are drawn into the film being formed by the photo CVD reaction, causing deterioration of the film properties.

SUMMARY OF THE INVENTION

An object of this invention is to provide, with due consideration to the drawbacks of such conventional devices, a photo CVD system which makes it possible to prevent, without using the oil coating on the window that is transparent to ultraviolet radiation, a thin film of reaction products from forming on the window; or to reduce the rate of thin film formation.

A thin film manufacturing system of the present invention comprises a reaction vessel with a window that is transparent to ultraviolet radiation, a means of exhausting gas from the reaction vessel to a reduced pressure condition, a means of introducing a gas into the reaction vessel to form a thin film, a source of ultraviolet radiation that activates the gas, and slits provided at a predetermined interval on the window that is transparent to ultraviolet radiation.

DETAILED DESCRIPTION OF THE PREFERRED EMBODIMENTS

This invention will be explained in detail below through descriptions of embodiments.

Figure 1:
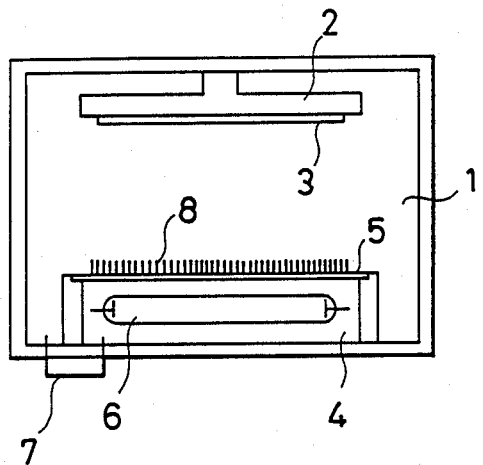
FIG. 1 is a diagram showing an embodiment of the system of this invention.

FIG. 1 shows an outline of the system of the first embodiment according to the present invention. Inside the reaction vessel (1), a substrate support body (2) performs the functions of both substrate heater and substrate support body. A low pressure mercury lamp (6) is used as the ultraviolet radiation source. The ultraviolet radiation source chamber (4) is depressurized through the system (7) and is next to the reaction chamber (1) from which it is separated by a window made of quartz glass (5) that is transparent to ultraviolet radiation.

Aluminum plates are used for the slits (8) on the window which is transparent to ultraviolet radiation. The slits or aluminum plates are provided over the whole surface of the window, having a thickness of 400 μm, a height of 2 mm with varying intervals. The window, made of synthetic quartz, is 150 mm × 150 mm and has a thickness of about 3 mm.

This system was used for trial manufacture of a silicon nitride thin film by the photo CVD method. The manufacture conditions are given below.

| gas flow rate | $Si_2H_6$ | 10 CCM |
|---|---|---|
| | $NH_3$ | 400 SCCM |
| | $N_2$ | 500 SCCM |
| reaction pressure | | 400 Pa |
| substrate temperature | | 250° C. |

Under these conditions, silicon nitride thin films were produced with varying slit intervals, and the film thickness for each slit interval was monitored.

The slits or aluminum plates were 2 mm high and 0.4 mm wide.

Figure 2:
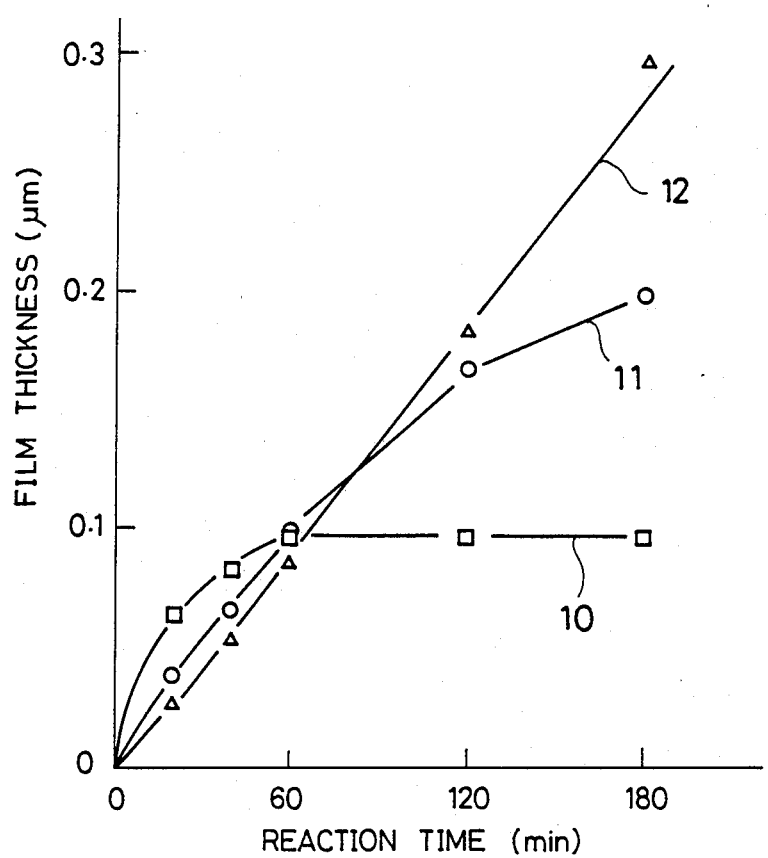
FIG. 2 is a graph showing a relation between thin film thickness and reaction time obtained using this invention.

The relation between thickness of the thin film formed on the substrate and reaction time for no slit, slit interval 0.5 mm and slit interval 3 mm is shown in FIG. 2.

As can be seen in this figure, in the case without slits shown by curve (10), the film stopped forming on the substrate after a reaction time of about 60 minutes. With slits, although there was a difference in degree depending on the interval, the film growth still had not reached its limit after 60 minutes. In the case of a slit interval of 0.5 mm, shown by curve (12), the film grew to 3,000 angstrom units after 180 minutes; and even then it had still not reached its limit.

Figure 3:
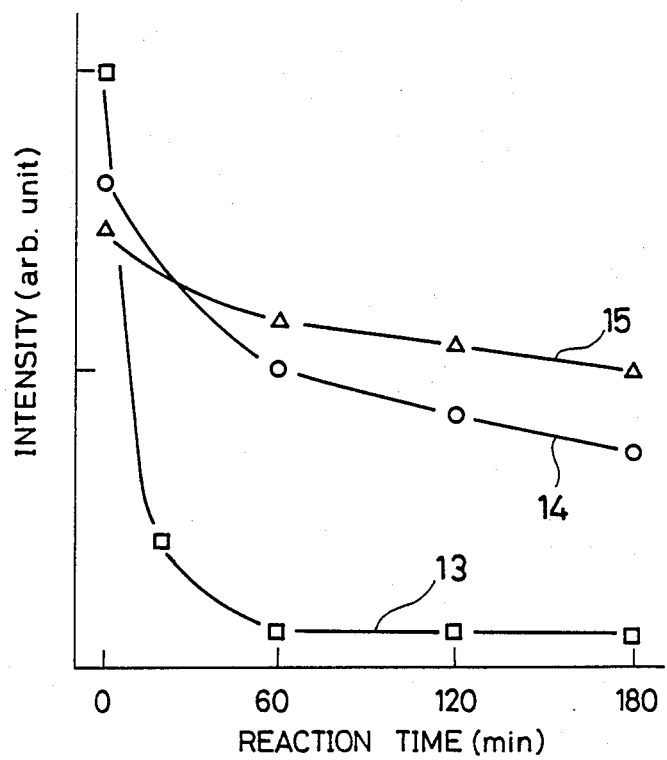
FIG. 3 is a graph showing a relation between intensity of ultraviolet radiation penetrating into the chamber and reaction time.

The reason for this is thought to be that the rate of deposition of reaction products on the window (5) transparent to ultraviolet radiation is slowed down. As shown in FIG. 3, there is a tendency for the intensity of 185 nm ultraviolet radiation penetrating into the reaction chamber to decrease with reaction time. This is thought to be because reaction products deposit on the window transparent to ultraviolet radiation.

However, it is apparent that when the cases with slits (8) provided on the window as shown by the curves (14) and (15) are compared to the case without slits as shown by the curve (13), the rate of reduction of ultraviolet radiation intensity is small and the rate of deposition of reaction products on the window is slow.

By providing such slits (8) on the window transparent to ultraviolet radiation, the rate of deposition of reaction products on the window (5) can be reduced.

As shown in FIG. 2 and FIG. 3, up to a reaction time of 60 minutes, the slits (8) reduce the initial ultraviolet radiation intensity and therefore the initial rate of formation of film on the substrate; but since there is no limiting thickness, using the slits (8) is advantageous whenever a film thicker than the commonly used 1,000 angstrom units thickness is to be formed.

The relation between the height of these slits (8) and the interval between them varies somewhat depending on the type of thin film being formed. In general the desired effect is produced when the height-to-interval ratio is 0.7 or larger. When the ratio becomes 1 or larger, the rate of deposition of reaction products on the window transparent to ultraviolet radiation becomes quite slow.

The thinner the plates by which the slits are formed, the larger the opening degree and the faster the deposition of film on the substrate.

Figure 4:
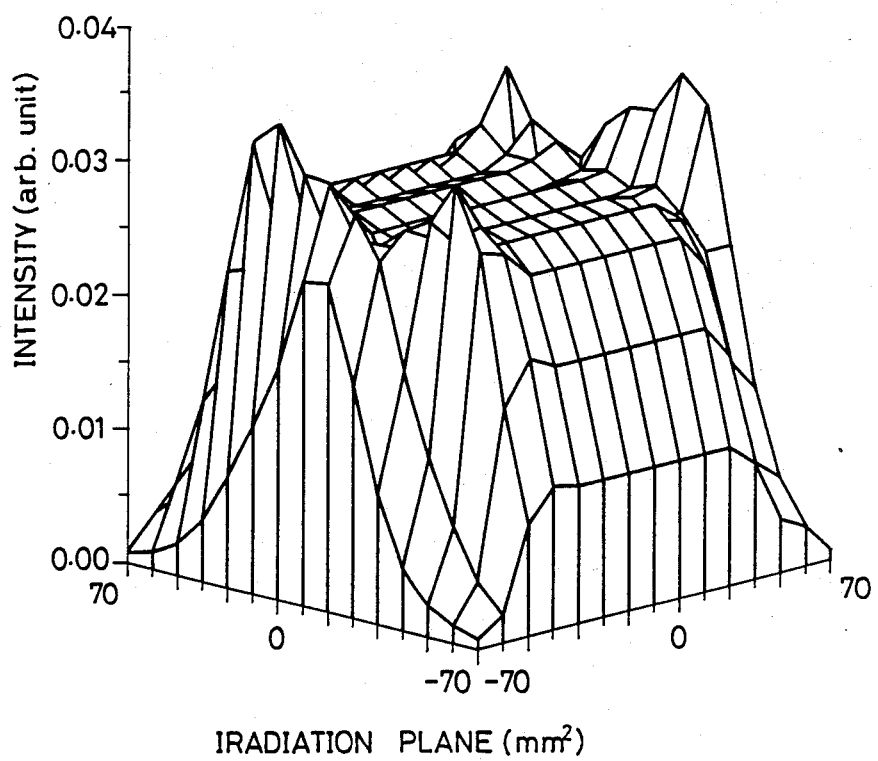
FIG. 4 is a graph showing intensity distribution of ultraviolet radiation in a radiation range.

Even when these slits are formed on the window transparent to ultraviolet radiation (5), there is no unevenness in the intensity of ultraviolet radiation incident on the substrate. As shown in FIG. 4, the intensity of incident ultraviolet radiation is nearly uniform within a 120 mm×120 mm area; the thickness of the formed film is uniform within ±5%.

The ordinate in FIG. 4 is radiation intensity in arbitrary scale units.

By making the slits of a material that strongly reflects ultraviolet radiation, the intensity of incident radiation entering the reaction chamber can be increased. For this reason, metal is used, but substantially the same effect can be obtained by using a non-metal coated with metal.

This method has one more advantage: by applying a voltage equal to or greater than the threshold electrical discharge voltage between the slits (8) and the substrate support body (2) after the film has formed, and introducing etching gas into the reaction chamber, the inside of the reaction chamber and the window transparent to ultraviolet radiation can be cleaned with the same equipment setup.

Next, in the second embodiment, an amorphous silicon film was formed with the same equipment that was used in the first embodiment.

The gas that was used to form the film was 10% $Si_2H_6$ in a helium base, allowed to flow in at a rate of 20SCCM under a reaction pressure of 400 Pa. Other experimental conditions were exactly the same as in Embodiment 1. In this embodiment, the slit interval was about 1 mm. After a reaction time of 60 minutes, the thin film grew to a thickness of about 1,200 angstrom units, and the amount of reaction product deposited on the window was still small.

By using the configuration of this invention, compared to prior art photo CVD systems, the limiting thickness of the film formed was increased by about a factor of 3 or more. For this reason, this invention has wide application in the formation of film by the photo CVD method.

Also, since it is not necessary to apply oil to the window transparent to ultraviolet radiation, as in the prior art systems, impurities are not introduced into the film that is formed, giving improved film quality.

In addition, by applying a voltage equal to or greater than the electrical discharge threshold voltage between the slits and the substrate support body, and by using etching gas for the reaction, the inner wall of the reaction chamber can be subjected to etching using the same equipment, which is an additional advantage.

In summary, a thin film manufacturing system of the present invention comprises a reaction vessel with a window that is transparent to ultraviolet radiation, a means of exhausting gas from the reaction vessel to a reduced pressure condition, a means of introducing a gas into the reaction vessel to form a thin film, a source of ultraviolet radiation that activates the gas, and slits provided at a predetermined interval on the window that is transparent to ultraviolet radiation. Upstanding plates of material are placed at a predetermined interval on the window transparent to ultraviolet radiation to form slits on the window; the effect of these slits is to prevent reaction products from depositing on the window between thin plates, or at least to slow the rate of formation.

Although the thin plates in the embodiments are made of aluminum, the thin plates can be made of a metal selected, depending on the reactive gas used, from the group of aluminum, molybdenum, tungsten, stainless steel, platinum, nickel, chromium, silver, magnesium, nickel, zinc, cobalt, iron and indium, and their alloys. It is desirable to provide the slits with a high opening degree.

Also, although the substrate support body serves as a second electrode in the embodiments above, the invention is not limited to this particular configuration.

Thus, this invention is not limited to the embodiments described here.

What is claimed is:

1. A thin film manufacturing system comprising a reaction vessel with a window that is transparent to ultraviolet radiation, exhaust means for exhausting gas from the reaction vessel to a reduced pressure condition, introduction means for introducing a gas into the reaction vessel to form a thin film, a source of ultraviolet radiation that activates the gas, and reduction means for reducing build up of the thin film on the window that is transparent to ultraviolet radiation, the reduction means comprising a plurality of spaced vertical plates disposed on the window that are transparent to ultraviolet radiation to form slits therebetween that are transparent to ultraviolet radiation.

2. The thin film manufacturing system as described in claim 1, wherein the spaced vertical plates provided on the window that is transparent to ultraviolet radiation have a height to interval ratio of 0.7 or more.

3. The thin film manufacturing system as described in claim 2, wherein the spaced vertical plates provided on the window transparent to ultraviolet radiation are made of one member selected according to the reactive gas used, from the group of aluminum, molybdenum, tungsten, stainless steel, platinum, copper, chromium, silver, magnesium, nickel, zinc, cobalt, iron and indium, and their alloys.

* * * * *